Oct. 27, 1964 E. H. SCHROT 3,153,841

METHOD OF MANUFACTURING A RADIO FREQUENCY COIL

Filed June 6, 1960

INVENTOR.
Ernest H. Schrot
BY John L. Wiegreffe
ATTY.

United States Patent Office 3,153,841
Patented Oct. 27, 1964

3,153,841
METHOD OF MANUFACTURING A RADIO FREQUENCY COIL

Ernest H. Schrot, Chicago, Ill., assignor to Admiral Corporation, Chicago, Ill., a corporation of Delaware
Filed June 6, 1960, Ser. No. 33,989
4 Claims. (Cl. 29—155.57)

This invention relates generally to inductance coils and particularly to the manufacture of inductance coils which are of the "slug-tuned" type.

As used hereinafter, the term inductance coil, will be understood to include all types of high frequency coils regardless of their particular applications such as radio frequency, antenna, and oscillator coils. It should also be noted at the outset that the types of inductance coils with which the invention is concerned are those which are arranged to have their inductance varied by the movement of an iron core slug of conventional design.

In present day ratio receiving apparatus of the superheterodyne type, and also in older receiving apparatus of the tuned radio frequency type, it is common to use both variable capacitance and variable inductance tuning means for tuning the receiving set to one of a number of transmitted carrier waves. In FM receivers, in particular, variable inductance tuning is advantageous and widely used.

In such FM receivers of the superheterodyne type, there are at least two variable inductances provided, one of which is generally associated with a radio frequency amplifying stage and the other of which is associated with an oscillator-mixer stage. It is also known to use a variable inductance for the antenna coil of such receivers to increase the gain and selectivity thereof, and it will be understood that the following is applicable also to antenna coils, when their use is dictated.

In a conventional radio frequency coil of constant pitch, adapted to have its inductance varied by movement of an iron core slug within its magnetic field, the resonant frequency thereof varies in a complex manner with linear movement of the slug. In an effort to maximize the linearity of the tuning indicator scale on the receiving set (to avoid crowding of stations on the dial indicator at the high frequency end of the tuning band) it has been common to wind these coils with a progressive pitch.

As is well known in superheterodyne receivers, the carrier wave is heterodyned with a signal from a local oscillator in a mixer stage to produce an intermediate frequency beat signal which is dependent upon the difference between the carrier frequency and the oscillator frequency. To obtain the benefits of this system the resonant frequency of the radio frequency coil and of the oscillator coil must be varied at the same rate to insure that the oscillator frequency is always a predetermined amount away from the carrier frequency. Thus, regardless of the carrier frequency to which the receiver is tuned, the intermediate frequency is the same. Consequently, good selectivity and gain can be obtained in such a receiver as the following amplifying stages may be sharply tuned to the IF frequency.

Prior art radio coils have been wound both by hand and by machine. The coils are generally of two types, those which are wound with solid wire and those which are fabricated of flat foil, either solid or ribbon. One of the major problems confronting the coil winder is that of securing the ends of the finished coil to terminals on the coil form. Invariably this securing action results in distortion of at least the end turns of the coil, and is a prime source of frequency mistracking. The foil type coils are easier to fabricate in this respect, since more flexibility is inherent in the foil material. However the foil type coil has the disadvantage of being difficult to adjust to correct for mistracking as the foil, not being self supporting, is generally glued completely to the form. To a great extent this is true also for wire types, especially where the wire used is very fine.

At present, coil manufacturers have to check each coil for frequency tracking accuracy before shipment. The radio manufacturer generally checks them again upon receipt. Finally each finished receiver is given another check to assure that proper frequency tracking occurs, At this stage rejects are costly, especially if minor adjustments in the coil pitch cannot be made. The invention contemplates a large decrease in the number of "off frequency" coils and eventual elimination of all but the final check in the completed receiver.

While in the foregoing, it has been assumed that the radio frequency coil is adjusted to track along with the oscillator coil (conventional practice) the process may be reversed, that is, the oscillator coil may be adjusted to track with the radio frequency coil. The problem is compounded when a variably tuned antenna coil is used, since then three coils must be made to track with each other.

The invention contemplates an entirely different approach in making, on a production basis, coils which will have an extremely high degree of tracking accuracy. In designing a receiver an initial laboratory wired model is usually developed. In constructing and perfecting the laboratory model, the coils mentioned above are manually adjusted to obtain proper frequency tracking. Once the laboratory model is working satisfactorily, it is a relatively simple matter to dimension the coils. The invention contemplates that the coils be preformed, on a production line basis, of wire of sufficient stiffness to insure that the preformed coil maintains its shape during normal handling. This preforming may be done on a conventional mandrel, but is preferably carried out on a spring winding machine, which is well known in the art relating to spring making. On a spring winding machine the pitch of each individual convolution may be preset and, depending upon the complexity of the machine, the ends of the coil may be formed into various shapes—all automatically. To repeat, in the practice of the invention, it is preferable that both the oscillator and the radio frequency coil be manufactured according to the method to be described. Accordingly it is a primary object of this invention to provide a method of manufacturing an inductance coil which will have predeterminable tracking characteristics.

Another object of this invention is to provide an inductance coil of high accuracy which is more economical than similar type coils now in use.

A further object of this invention is to provide a method of accurately winding and assembling high frequency coils of such uniformity so as to obviate the need of costly frequency tracking tests.

A feature of this invention lies in the provision of terminations on an inductance coil of such character that good mechanical and electrical connections can be made to wire receiving terminals on the coil form without disturbing the coil frequency tracking characteristic.

Other objects and features of this invention will become apparent upon a reading of the specification in conjunction with the drawing in which FIG. 1 depicts a partial block and partial schematic diagram of radio receiving apparatus with which the invention may be used;

Figure 1:
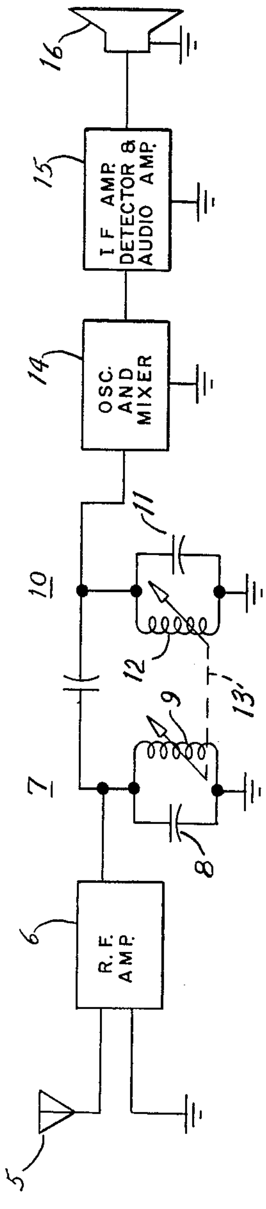

Referring now to FIG. 1, an antenna 5 couples received information bearing carrier signals to an RF amplifier 6 which feeds tuned circuit 7. Tuned circuit 7 includes a capacitor 8 and a variable inductance 9 which will be described more fully hereinafter. The frequency of tuned circuit 7 is varied manually by adjusting the inductance of RF coil 9 to selectively tune the plurality of carrier frequency waves present at antenna 5. The output of tuned circuit 7 is coupled to oscillator-mixer 14. An oscillator tuned circuit 10 comprising a variable inductance 12 and a fixed capacitor 11 is arranged to oscillate at a frequency a predetermined amount away from the frequency of tuned circuit 7. Oscillator-mixer 14 combines the signals from tuned circuits 7 and 10 in a well known manner to produce an intermediate frequency signal which is then fed to block 15 containing an IF amplifier, detector and audio amplifier. The information is removed from the carrier in the detector, amplified in the amplifier and thereafter used to drive speaker 16 to produce a sound output. It will be noted that inductance 9 and inductance 12 are ganged together, as indicated by dashed line 13 joining these components, to provide for simultaneous adjustment of their respective inductances.

It will be understood that variable inductances 9 and 12 are of the slug tuned type, that is, tuning or inductance change is accomplished by moving a powdered iron slug along the center-line of the coil. It is imperative that the frequency of tuned circuit 7 and the frequency of tuned circuit 10 remain a predetermined amount apart so that the intermediate frequency produced by heterodyning is the same regardless of the particular carrier frequency to which the receiver is tuned. In other words coils 9 and 12 must change inductance equally for equal movement of the individual iron cores (not shown) within their respective fields.

Figure 2:
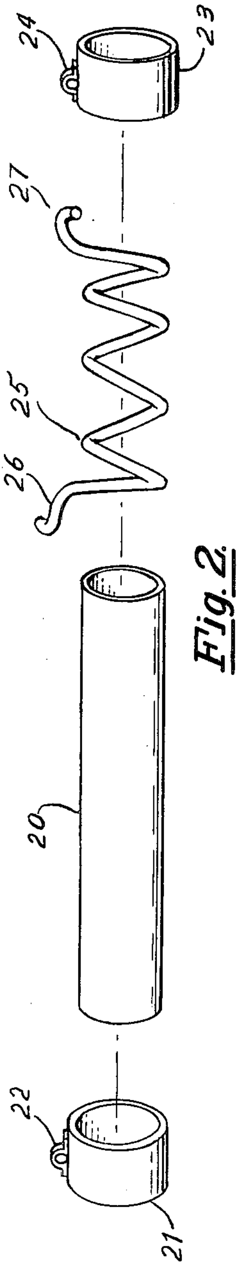
FIG. 2 is an exploded view of the components of the inductance coil of the invention.

FIG. 2 shows an exploded view of a radio frequency coil constructed in accordance with the invention, and which may be used for coils 9 and 12. A cylindrical, hollow coil form 20 of insulating material is provided. The inside diameter of the coil form is such to allow an iron core slug (not shown) substantially free longitudinal movement therein, but very little radial movement. A pair of end collars 21 and 23 individually including wire receiving terminals 22 and 24, respectively, are also provided. Each collar has an inside diameter which is slightly greater than the outside diameter of coil form 20 to provide for relative movement along and about the form. Coil 25, which is preformed, is constructed in a manner to be hereinafter described and is made of wire of sufficient tension to independently maintain whatever configuration it is given. Preformed coil 25 is fabricated with substantially U-shaped hook terminal portions 26 and 27, more clearly shown in FIG. 3. The ends of terminal portions 26 and 27 are designed to fit snugly within the wire receiving terminals 22 and 24, respectively, of the end collars. Preferably the terminal portions 26 and 27 lie in planes inclined to the axis of the coil to provide clearance over the end collars 21 and 22, respectively. The free ends of these terminal portions are at right angles with respect to the coil axis and are designed to fit in the wire receiving terminals 22 and 24 of end collars 21 and 23, respectively, via a simple rotational movement of either the collar or the coil.

Figure 3:
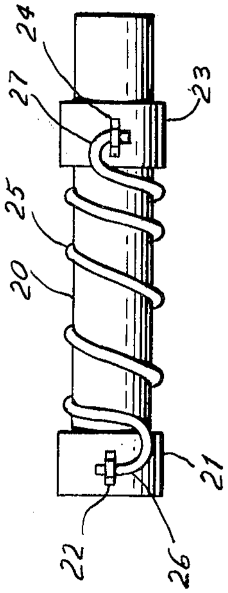
FIG. 3 is an assembled view of a completed inductance coil of the invention.

Referring to FIG. 3, an assembled view of the coil fabricated in accordance with the teachings of the invention is shown. In assembling the coil, end collar 21 is slipped over one end of coil form 20 and glued thereon. Preformed coil 25 is then slipped over the other end of coil 20, brought up to collar 21 and rotated until hook portion 26 engages wire receiving terminal 22. Thereafter end collar 23 is slipped over the same end of coil form 20, moved longitudinally along coil form 20 until it is adjacent to the free end of coil 25, and is then rotated to engage its wire receiving terminal 24 with hook portion 27 of coil 25. Collar 23 is then glued to coil form 20.

The connections between wire receiving terminals 22 and 24 and hook portions 26 and 27 respectively may be soldered, either before or after the coil is wired into a receiver. It should be noted that with this method of assembly it is unnecessary to glue the entire coil 25 to coil form 20 as is commonly the case, since coil 25 exhibits sufficient structural rigidity to maintain its shape under normal handling conditions. It should also be noted that the use of hook portions on the coil ends and mating wire receiving terminals on the collars prevents distortion of the end turns of the coil due to wrapping the wire around the terminal or otherwise attempting to make a secure mechanical connection between the coil and the terminal. This arrangement also provides good structural rigidity since the end collars, once glued, are no longer free to rotate about coil form 20.

Coil 25 may be formed in a number of ways, one of which includes winding it on a mandrel and forming the hook portions 26 and 27 with "round-nosed" pliers. Preferably however, for greater uniformity and economy, it is wound on a spring winding machine of the type which may be automatically set to wind a coil having a particular pitch between each convolution thereof. Machines of this type also have provision for automatically forming hook portions 26 and 27 of coil 25. Thus once the spring machine is set, coil 25 may be prewound in substantially the shape shown. Other types of terminating portions may be provided for coil 25, but it will be recognized that the preferred form is as shown in FIG. 3. The criteria for the terminating portions of the coil are that wrapping or bending these portions after the coil has been assembled on the core must be avoided, and that a good mechanical connection must be made between these portions and the wire receiving terminals on the collars. Unless extreme care is exercised, wrapping or bending the end leads of the coil around the wire terminals after the coil has been placed on the form will invariably result in deformation of the coil, at least with regards to the end turns thereof. This deformation results in loss of frequency tracking accuracy and is the major deficiency of the coil winding methods used in the prior art.

By winding these high frequency coils in accordance with the teachings of the invention, it is now feasible to mass produce and assemble such coils without the necessity of checking the frequency tracking characteristics of each one as has been customary in the past. Additionally, this method of construction is much more economical than those heretofore used.

Thus what has been described is a novel method of making and assembling a radio frequency coil. It is contemplated that numerous modifications may be made herein without departing from the true spirit and scope of the invention as defined in the appended claims.

What is claimed is:

1. The method of manufacturing a radio frequency coil comprising the steps of prewinding the coil, from wire capable of self maintaining its configuration, on a mandrel; forming a connecting hook at each end of the coil; slipping the coil over an insulated form; sliding an end collar having a wire receiving terminal adapted for mating engagement with said connecting hooks, over one end of said form; rotating the coil to engage the adjacent one of said hooks with the wire receiving terminal of the end collar; sliding another end collar having a similar wire receiving terminal thereon over the other end of said form; rotating said last mentioned end collar to engage its wire receiving terminal with the other hook of the coil; and securing the end collars in their respective positions on the form without deforming said coil.

2. The method of manufacturing a helical radio frequency coil comprising the steps of; winding the coil from wire capable of self maintaining its configuration, on a spring winding machine; forming the end leads of the coil into substantially U-shaped hooks, said U-shaped hooks lying in planes inclined to the longitudinal axis of said coil and having their free ends disposed substantially perpendicular to said axis; providing a cylindrical insulated coil form having an outside dimension slightly less than the inside dimension of the coil; providing a pair of end collars, each having a wire receiving terminal thereon, adapted for relatively free movement along and about said coil form; placing one of said end collars over one end of the form and securing it thereto; slipping the coil over the other end of the form; rotating the coil to engage its hooked end with the wire receiving terminal of said one end collar; sliding the other end collar over said other end of said form; and rotating said other end collar to engage its wire receiving terminal with the other hook portion of said coil; securing said other end collar to said form.

3. The method of manufacturing a helical radio frequency coil comprising the steps of; winding the coil on a mandrel, said coil being made from wire sufficiently stiff to independently maintain its shape; bending the wire at the ends of the coil into U-shaped hook portions; providing a hollow, cylindrical form of insulating material having an outside diameter slightly less than the inside diameter of said coil, said form including a portion at one end of larger outside diameter than said coil, said portion having a wire receiving terminal thereon adapted for mating engagement with said U-shaped hook portion; sliding the coil over the insulated form and engaging the hook portion adjacent to said wire receiving terminal with said wire receiving terminal; slipping a collar having a similar wire receiving terminal over the small end of said form; aligning said collar with respect to the other hook portion of said coil and engaging said other hook portion with the wire receiving terminal of said collar; securing said collar to said form without deforming said coil.

4. The method of manufacturing a radio frequency coil comprising the steps of pre-winding the coil, of wire capable of maintaining its configuration, on winding means; forming connecting means at each end of the coil; slipping the coil over a form; placing an end piece having terminal means adapted for engagement with said connecting means on one end of said form; engaging the adjacent connecting means of said coil with the terminal means of the end piece; placing another similar end piece on the other end of said form; moving said last-mentioned end piece into engagement with the adjacent connecting means of the coil; and securing the end pieces in their respective positions on the form without deforming the coil.

References Cited in the file of this patent

UNITED STATES PATENTS

| | | |
|---|---|---|
| 908,701 | Rutherford | Jan. 5, 1909 |
| 1,832,466 | Means | Nov. 17, 1931 |
| 2,030,333 | Starkey | Feb. 11, 1936 |
| 2,334,687 | Moll | Nov. 16, 1943 |
| 2,372,082 | Iden | Mar. 20, 1945 |
| 2,402,122 | Bullinger | June 18, 1946 |
| 2,836,805 | Goldsmith | May 27, 1958 |
| 2,843,159 | Bonde et al. | July 15, 1958 |
| 2,913,640 | Edgarton | Nov. 17, 1959 |
| 2,929,132 | Wohlhieter | Mar. 22, 1960 |
| 2,960,757 | Epstein | Nov. 22, 1960 |
| 2,961,624 | Bender | Nov. 22, 1960 |
| 2,965,865 | Zack | Dec. 20, 1960 |
| 2,972,713 | Sutton | Feb. 21, 1961 |

FOREIGN PATENTS

| | | |
|---|---|---|
| 162,729 | Austria | Aug. 15, 1948 |
| 468,423 | Canada | Sept. 26, 1950 |